(12) United States Patent  (10) Patent No.: US 9,148,142 B2
Hu                         (45) Date of Patent:     Sep. 29, 2015

(54) CAPACITIVE TOUCH KEYBOARD

(71) Applicant: Touchplus Information Corp., New Taipei City (TW)

(72) Inventor: Shih Hsien Hu, New Taipei (TW)

(73) Assignee: TOUCHPLUS INFORMATION CORP., New Taipei (TW)

( * ) Notice: Subject to any disclaimer, the term of this patent is extended or adjusted under 35 U.S.C. 154(b) by 455 days.

(21) Appl. No.: 13/724,745

(22) Filed: Dec. 21, 2012

(65) Prior Publication Data
US 2014/0097885 A1   Apr. 10, 2014

(30) Foreign Application Priority Data

Oct. 5, 2012 (TW) .............................. 101136948 A

(51) Int. Cl.
*H03K 17/975* (2006.01)
*H03K 17/96* (2006.01)
*G06F 3/044* (2006.01)
*H03K 17/98* (2006.01)

(52) U.S. Cl.
CPC ............ *H03K 17/9622* (2013.01); *G06F 3/044* (2013.01); *H03K 17/98* (2013.01); *H03K 2017/9602* (2013.01); *H03K 2217/96062* (2013.01)

(58) Field of Classification Search
CPC ....... H01H 1/00; H01H 13/70; H01H 13/702; H01H 13/703; H01H 13/704; H01H 2239/074; H01H 2203/008; H01H 2207/01; H01H 2221/00; H01H 2231/002; H01H 2231/012; H01H 2231/016; H01H 2231/052; H01H 2239/006; H03K 17/975
USPC .......... 200/600, 46, 5 R, 292, 511–512, 11 D, 200/11 DA, 5 A; 345/173–178; 178/18.01–18.11
See application file for complete search history.

(56) References Cited

U.S. PATENT DOCUMENTS 7,030,860 B1 *  4/2006  Hsu et al. ....................... 345/173
8,564,556 B2 * 10/2013  Lee et al. ....................... 345/173
2005/0257628 A1 * 11/2005  Nikaido et al. ............ 73/862.541

* cited by examiner

*Primary Examiner* — Edwin A. Leon
*Assistant Examiner* — Anthony R. Jimenez
(74) *Attorney, Agent, or Firm* — Muncy, Geissler, Olds & Lowe, P.C.

(57) ABSTRACT

A capacitive touch keyboard includes a soft shielding layer, a soft intermediate layer, and a one dimensional sensor layer where the soft intermediate layer is interposed between the other two to form a capacitor structure. The soft shielding layer includes a ground plane, a dielectric material covering on the ground plane, and plural key areas at its outer surface. The one dimensional sensor layer includes plural sensing cells which correspond to the key areas, and respective cells are electrically connected to a capacitance sensing circuit. Therefore, features of more compact size, simplified structure design, and tactile feel are provided in a capacitive keyboard.

20 Claims, 9 Drawing Sheets

CAPACITIVE TOUCH KEYBOARD

The current application claims a foreign priority to the patent application of Taiwan No. 101136948 filed on Oct. 5, 2012.

FIELD OF THE INVENTION

The invention is relevant to a keyboard device, especially to a capacitive touch keyboard with pressure detection and plural responsive functions.

DESCRIPTION OF THE PRIOR ART

Presently, most known keyboard device can be categorized into two types, contact type and contactless type. The first one is mostly referred to mechanical keyboard and membrane keyboard, in which current flows through contact points to provide pressing signals to a control circuit as input in response to depressing of a finger on a keyboard key. A circuit model for such conventional keyboard is shown in FIG. 1 as a 5×8 keyboard matrix. A short circuit is formed upon depressing action of user's finger on a keycap such that the depressed key can be detected.

As to the second one, contactless type keyboard, a representative product is capacitive keyboard, including mechanical type, touch button type, and virtual keyboard. A mechanical capacitive keyboard is shown in FIG. 2, in which when a user depresses a keycap 911, a top plate 912 is pushed toward a PCB 913 laid on bottom so that a capacitance between two plates 912 and 913 is changed and then detected for achieving input purpose.

Referring to FIG. 3, an illustration of a conventional touch button type capacitive keyboard; in the keyboard, alternating current normally flows through a circuit. When a user depresses a key 921 with his finger, the capacitance of the keyboard is changed and is detected by a sensing controller 922 as a key input.

Nowadays, projective capacitive touch technology has been widely used in various consumer products such as mobile phones, tablets, or the like, in which a virtual type keyboard is utilized. The virtual keyboard is capable of identifying location (in coordinate sense) of a finger on a screen as key input, employs the same concept of identifying capacitance change while the finger is touching on a key as the capacitive keyboard above. FIGS. 4A and 4B show two kinds of capacitance sensing structure as one component of a virtual keyboard, one for double side bar type and the other for single side diamond type with bridge, and both of which are referred to two dimensional matrix electrode arrangement.

To sum up, conventional contact keyboard has drawbacks of poor reliability due to contact points and susceptibility to contamination while contactless keyboard is either expensive or lacking in tactile feel for depressing.

SUMMARY OF THE INVENTION

One objective of the present invention is to improve drawbacks of high cost and a lack of tactile feel for depressing in conventional capacitive keyboard.

Another objective of the present invention is to provide a capacitive touch keyboard not only offering tactile feel and gesture operation but also reducing device size and cost due to adoption of one dimensional single layer capacitance sensing structure.

To achieve the objectives above and others, a capacitive touch keyboard of the invention comprises a soft shielding layer, a soft intermediate layer, and a one dimensional sensor layer, arranged in the order from the up bottom, wherein the one dimensional sensor layer is electrically connected to a capacitance sensing circuit through such as an FPC.

The soft shielding layer includes a ground plane and a dielectric material covering on the ground plane. The soft shielding layer also includes plural key areas at the outer surface. The soft intermediate layer is interposed between the ground plane of the soft shielding layer and the one dimensional sensor layer, thereby forming a capacitor structure.

The one dimensional sensor layer includes plural sensing cells which correspond to the key areas wherein respective cells are electrically connected to the capacitance sensing circuit.

Through the keyboard design of the present invention, simplified structure is involved and a user is provided with clear tactile feel as downward deflection when depressing the shielding layer with his finger, and at the same time a clearance between the ground plane of the shielding layer and the sensing cells of the one dimensional sensor layer is also shortened so that a change on the capacitance of the keyboard is generated allowing the sensing circuit to recognize the depressed key.

Preferably, the dielectric material is referred to a PMMA, PET film, or rubber. The dielectric material may be provided with plural imprinted externally visible key labels correspond to (or aligned with) the key areas for identification of individual keys.

The soft intermediate layer may be formed to be a single plate type or plural spacers well known used in conventional resistive touch screen, and may be made of Optical Clear Resin (OCR) or Optical Clear Adhesive (OCA).

The soft shielding layer may be provided with plural openings corresponding to the key areas and optionally to non-key areas which are disposed between adjacent key areas (if there are) with each opening exposing the soft intermediate layer, thereby when a finger is placed on any openings a finger capacitance is produced due to absence of any ground plane at that position and consequently a gesture operation can be achieved by these openings.

Each of the sensing cells may be surrounded by six other cells, for example, each cell formed to be a hexagon, so as to form a honeycomb pattern altogether and there is an electrically connection between adjacent sensing cells contributing to better resolution on gesture operation.

The one dimensional sensor layer may be connected to the capacitance sensing circuit through an FPC. In the case of the non-key area, such as a between-keys space between the adjacent key areas, the one dimensional sensor layer may further comprise another sensing cell corresponding to the non-key area for proximate sensing. The one dimensional sensor layer may further comprise another ground plane disposed at a side opposite to all sensing cells and corresponding to the between-keys space for better signal stability. Furthermore, all ground planes (including those of the shielding layer, key-area and non-key area) may be configured to generate a stimulus voltage from the capacitance sensing circuit, providing an extremely sensitive proximate sensing.

The present invention, therefore, provides a capacitive touch keyboard comprising: a soft shielding layer comprising a ground plane and a dielectric material covering on the ground plane, wherein the soft shielding layer also comprises plural key areas at an outer surface; a one dimensional sensor layer comprising plural sensing cells corresponding to the plural key areas, wherein each of the plural sensing cells is shaped as hexagon so as to form a honeycomb pattern altogether, wherein a unit of the honeycomb pattern includes a center hexagons (cell) surrounded by six adjacent hexagons (cells); a soft intermediate layer interposed between the ground plane of the soft shielding layer and the one dimensional sensor layer so as to form a capacitor structure; and a capacitance sensing circuit electrically connected to the plural sensing cells to probe a capacitance change.

In another embodiment, a capacitive touch keyboard, comprises a soft shielding layer comprising a ground plane and a dielectric material covering on the ground plane, wherein the soft shielding layer also comprises plural key areas at an outer surface, wherein the soft shielding layer is provided with plural openings corresponding to the key areas and optionally to areas other than the key areas with each opening exposing the soft intermediate layer; a one dimensional sensor layer comprising plural sensing cells corresponding to the plural key areas and optionally to areas other than the key area used for touch sensing purpose as well, wherein each of the plural sensing cells is shaped as hexagon so as to form a honeycomb pattern altogether, wherein a unit of the honeycomb pattern includes a center hexagons (cell) surrounded by six adjacent hexagons (cells); a soft intermediate layer interposed between the ground plane of the soft shielding layer and the one dimensional sensor layer so as to form a capacitor structure; and a capacitance sensing circuit electrically connected to the plural sensing cells to probe a capacitance change.

BRIEF DESCRIPTION OF THE DRAWINGS

The primitive objectives and advantages of the present invention will become apparent upon reading the following description and upon reference to the accompanying drawings in which.

DESCRIPTION OF THE PREFERRED EMBODIMENT

The present invention provides a capacitive touch keyboard featuring that whole structure is quite simplified, tactile feel is provided upon depressing action, and keyboard size is reduced.

In order to fully understand the manner in which the above-recited details and other advantages and objects according to the invention are obtained, a more detailed description of the invention will be rendered by reference to the best-contemplated mode and specific embodiments thereof. The following description of the invention is made for the purpose of illustrating the general principles of the invention and should not be taken in a limiting sense; it is intended to illustrate various embodiments of the invention. As such, the specific modifications discussed are not to be construed as limitations on the scope of the invention. It will be apparent to one skilled in the art that various equivalents, changes, and modifications may be made without departing from the scope of the invention, and it is understood that such equivalent embodiments are to be included herein. The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this detailed description section. Where the context permits, singular or plural terms may also include the plural or singular term, respectively. Moreover, unless the word "or" is expressly limited to mean only a single item exclusive from the other items in a list of two or more items, then the use of "or" in such a list is to be interpreted as including (a) any single item in the list, (b) all of the items in the list, or (c) any combination of items in the list. Preferred embodiments and aspects of the invention will be described to explain the scope, structures and procedures of the invention. In addition to the preferred embodiments of the specification, the present invention can be widely applied in other embodiments.

Figure 1:
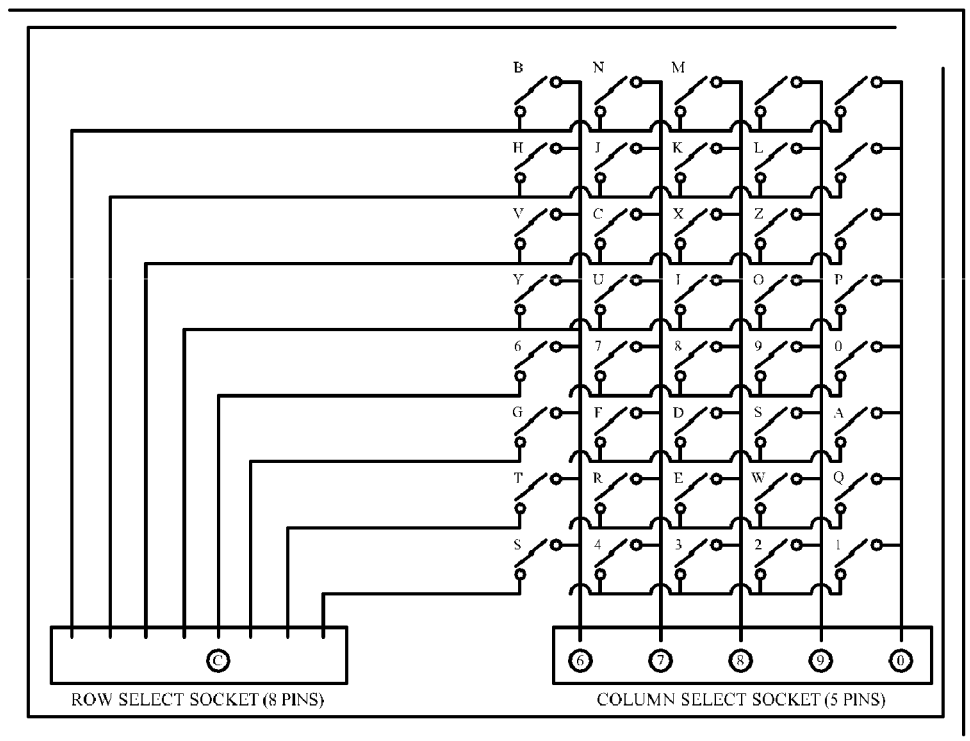
FIG. 1 is a circuit diagram of a conventional contact type keyboard.
Figure 2:
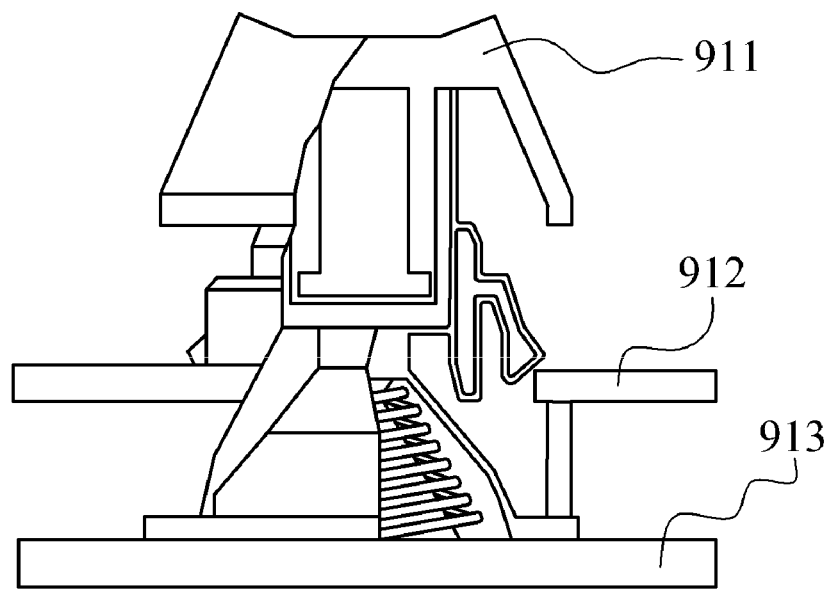
FIG. 2 is an illustration of a conventional mechanical capacitive keyboard.
Figure 3:
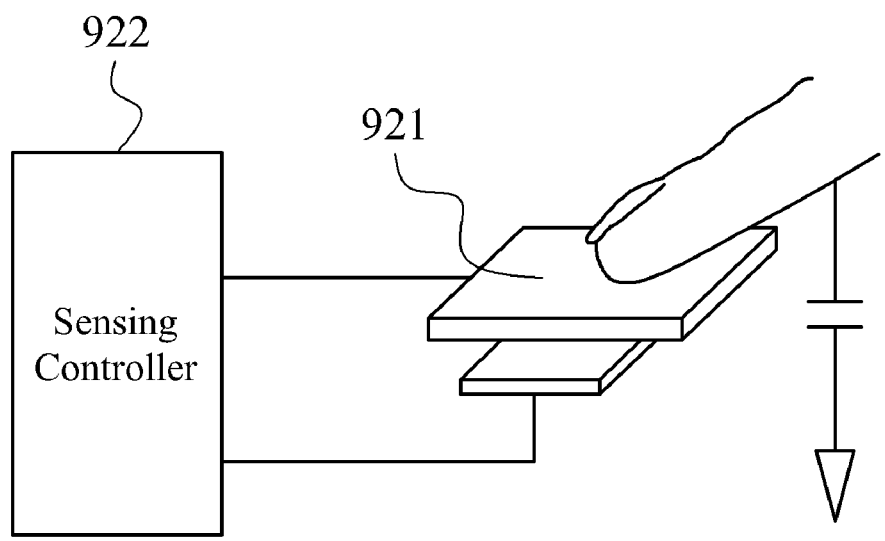
FIG. 3 is an illustration of a conventional touch button type capacitive keyboard.
Figure 4A:
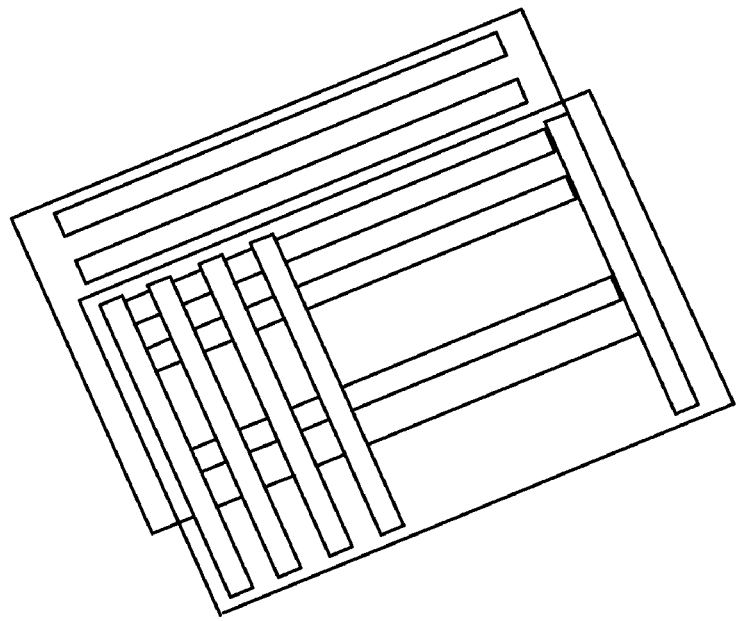
FIGS. 4A and 4B show illustrations of two conventional two dimensional capacitance sensing structure.
Figure 4B:
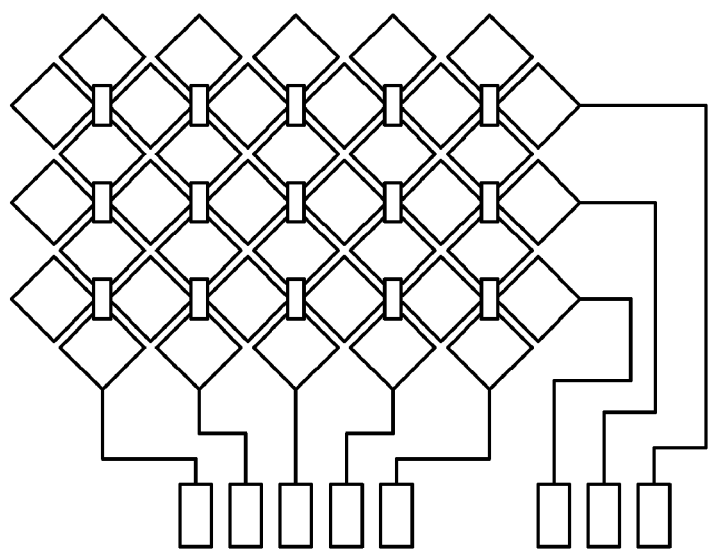
Figure 5:
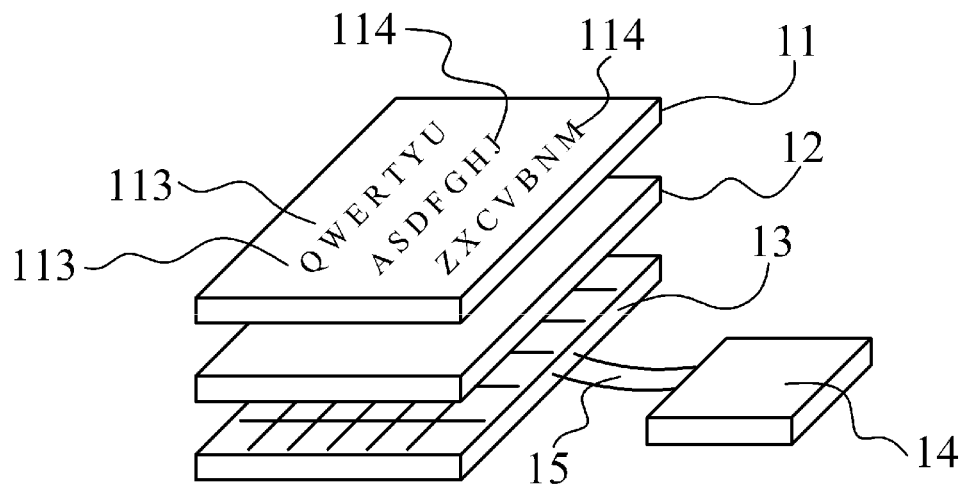
FIG. 5 is an illustration of a capacitive touch keyboard according to a first embodiment of the present invention.

Referring to FIG. 5, an illustration of a capacitive touch keyboard according to a first embodiment of the present invention; this example shows that a touch keyboard mainly includes a soft shielding layer 11, a soft intermediate layer 12, and a one dimensional sensor layer 13, stacked in the order from the top down.

The soft shielding layer 11 includes a conductive ground plane 111 and a dielectric material 112 covering on the ground plane 111. The soft shielding layer 11 has, at its outer surface, several key areas 113 representative of pre-set positions for input keys of the keyboard device, as 21 areas (matrix of 3 rows and 7 columns) shown in FIG. 5. The shielding layer 11 is made to deform temporarily when a user exerts a depressing force on it and return to its natural state when the force is released. Material selected for the ground plane 111 may be metal, e.g. copper, and the dielectric material 112 may be PMMA, PET film, or rubber. Plural key labels 114 are imprinted on the dielectric material 112 corresponding to different key areas 113 such as English letters shown in the figure and they provide the same identification as those letters in a traditional keyboard. These key labels 114 are certainly externally visible to provide visual identification for users.

Figure 7:
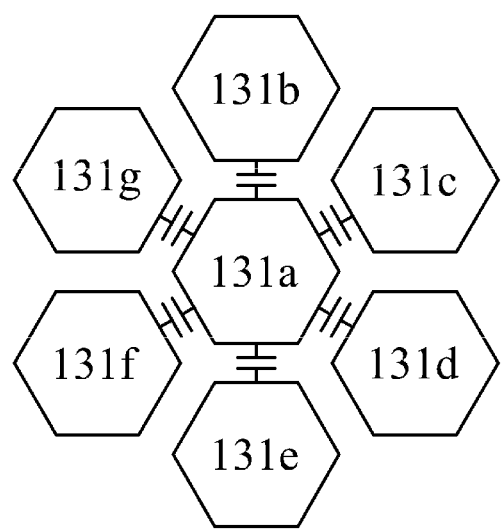
FIG. 7 is an illustration of a portion of sensing cells in a one dimensional sensor layer in FIG. 5.

The one dimensional sensor layer 13 is a single layer PCB fabricated by PCBA. In case of including component routing, PCB itself is normally 2-layer. The phrase "single layer" is used hereinafter particularly to differentiate from two ITO plates (as a row electrode and a column electrode respectively) employed in conventional sensor layers. In the embodiment the one dimensional sensor layer 13 includes plural hexagonal sensing cells, some of which are shown in FIG. 7 numbered as 131a through 131g, and all cells exhibit a honeycomb pattern. Each sensing cell is aligned with corresponding key area 113 of the soft shielding layer 11 and is electrically connected to a capacitance sensing circuit 14 through a conducting line where all conducting lines may be integrated in an FPC 15.

The ground plane of the shielding layer may be made of such as copper, silver paste, ITO, ATO, IZO, ZnO or the like, as well as combination of those mentioned above.

The soft intermediate layer 12 is interposed between the ground plane 111 of the soft shielding layer 11 and the one dimensional sensor layer 13, serving as a separation material of the two so that a capacitor structure of ground plane/intermediate layer/sensing cell is constituted. In the example, material selected for the soft intermediate layer 12 is OCR or OCA for an advantage that uniform distance between two plates of the capacitor structure is provided, allowing similar characteristics of the keyboard all over the device. Further, the soft intermediate layer 12 also serves as sponge buffer increasing tactile feel while the user is repressing the key.

Figure 6A:
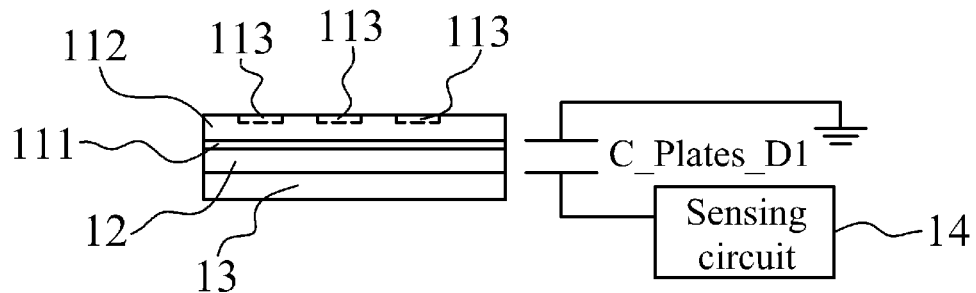
FIG. 6A is an illustration of cross-sectional view accompanying with related simplified capacitance circuit of the keyboard in FIG. 5 when the keyboard is not operated yet.
Figure 6B:
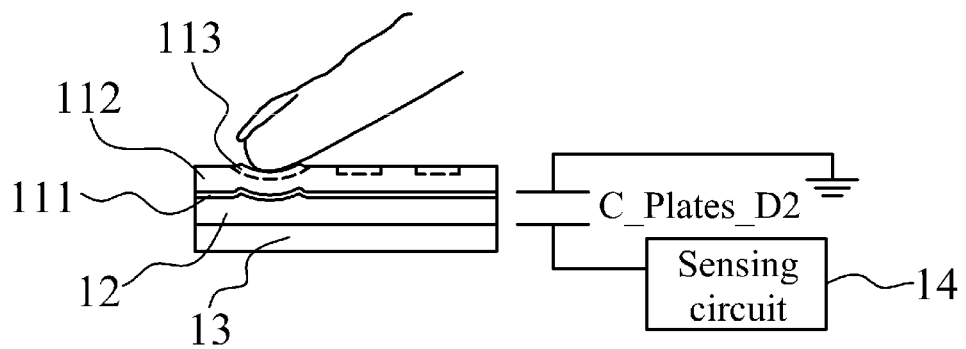
FIG. 6B is an illustration of cross-sectional view accompanying with related simplified capacitance circuit of the keyboard in FIG. 5 when a depression action is operated on it.

Referring to FIGS. 6A and 6B, an illustration of cross-sectional view accompanying with related simplified capacitance circuit of the keyboard in FIG. 5 when the keyboard is not operated yet and when a depression action is operated on the keyboard; when the keyboard device is not operated yet, the ground plane 111 and the one dimensional sensor layer 13 define a clearance of D1 and a capacitance signal probed in the sensing circuit 14 is denoted by C_Plates_D1 as shown in FIG. 6A. When a user depresses with his finger on an key area 113 of the soft shielding layer 11, the clearance between the ground plane 111 and the one dimensional sensor layer 13 is changed from D1 to D2 (D2 is smaller than D1) due to deformation occurs in the two layers 11 and 12 as shown in FIG. 6B, and the sensing circuit 14 probes a capacitance C_Plates_D2.

Therefore, through the novel structure above, capacitive keyboard device offers a depressing tactile feel and better operation confirmation to users and drawbacks in contact type keyboard are also avoided.

Figure 8:
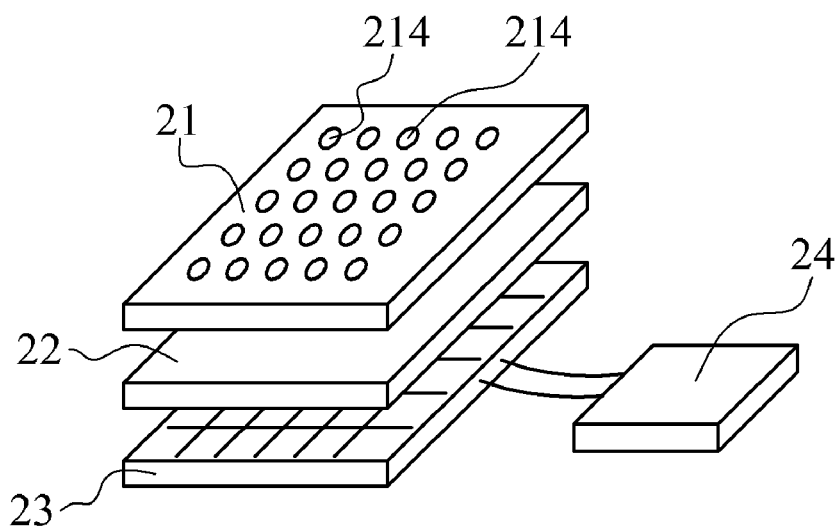
FIG. 8 is an illustration of a capacitive touch keyboard according to a second embodiment of the present invention.
Figure 9:
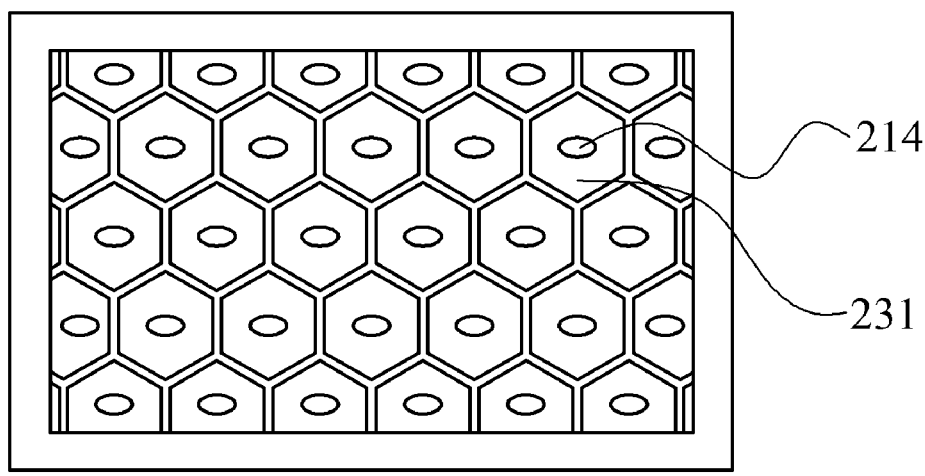
FIG. 9 is an illustration of arrangement for sensing cells and openings in FIG. 8.

Referring to FIG. 8, an illustration of a capacitive touch keyboard according to a second embodiment of the present invention, and to FIG. 9, an illustration of arrangement for sensing cells and openings in FIG. 8; the embodiment shares the same components as those in the first embodiment such as a soft shielding layer 21, a soft intermediate layer 22 and a one dimensional sensor layer 23, and related features are omitted here for simplicity. The difference from the first embodiment is that plural openings 214 are provided in the soft shielding layer 21 and each opening 214 extends through the ground plane 211 and the dielectric material 212 so that the intermediate layer 22 is exposed. The openings 214 correspond to sensing cells 231 of the sensor layer 23, and each opening 214 lies within profile of the corresponding sensing cell 231 as clearly shown in FIG. 9, a transparent top view.

Figure 10:
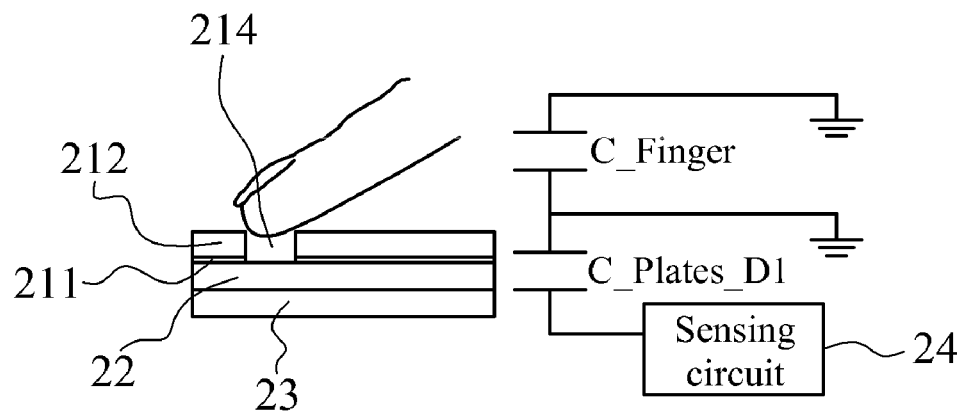
FIG. 10 is an illustration of cross-sectional view accompanying with related simplified capacitance circuit of the keyboard in FIG. 8 when a finger stays on one of the openings.

Since the ground plane disappears at where the openings is located, when a user gently touches (without "depressing") with his finger on that location, a finger capacitance is thus produced and denoted by C_Finger as shown in FIG. 10 and that a sensing circuit 24 probes a capacitance signal including C_Plates_D1 and C_Finger. Consequently, the sensing circuit is able to identify location of the finger and to track its movement, that is to say the openings 214 offer a gesture operation function, provided that definition is pre-set in related control circuit.

The honeycomb pattern formed by sensing cells is especially useful in the keyboard device with gesture operation function in that not only the sensing cells can be arranged in more compact form without wasting occupied area, but the maximum number of stimulus and sensing combination (63 for single cell, and more for cell grouping) (and thus better signal resolution) is provided. The sensor layer specifically comprises a substrate which may be PCB, the film or the glass sheet; sensor cells, which may be transparent, fabricated on the substrate. The sensor cells are formed with hexagon shapes and the pattern of the entire sensor cells is arranged to have the honeycomb configuration. As shown in the figure, the pluralities of the individual hexagons are arranged with seven hexagons to form a unit. One hexagon is surrounded by six adjacent hexagons. The center sensor cell may indicate one output signal when it is touched, and the center sensor cell with one of the adjacent sensor cells may indicate another output signal when the two sensor cells are touched. By the same reason, the combination of three, four and more sensor cells may be used to indicate certain output signal. Therefore, the unit of the sensor configuration may provide multiple output signals to indicate different instructions. The sensor cells are electrically connected to the control circuits. Thus, the touch panel of the invention can further locate the position of the finger more precisely. Therefore, although the sensor cell of the invention may be much larger than the sensor cell of the traditional touch panel, however, the touch panel of the invention can locate the position of the finger precisely and the unit of the present invention may output multiple signals.

Figure 11:
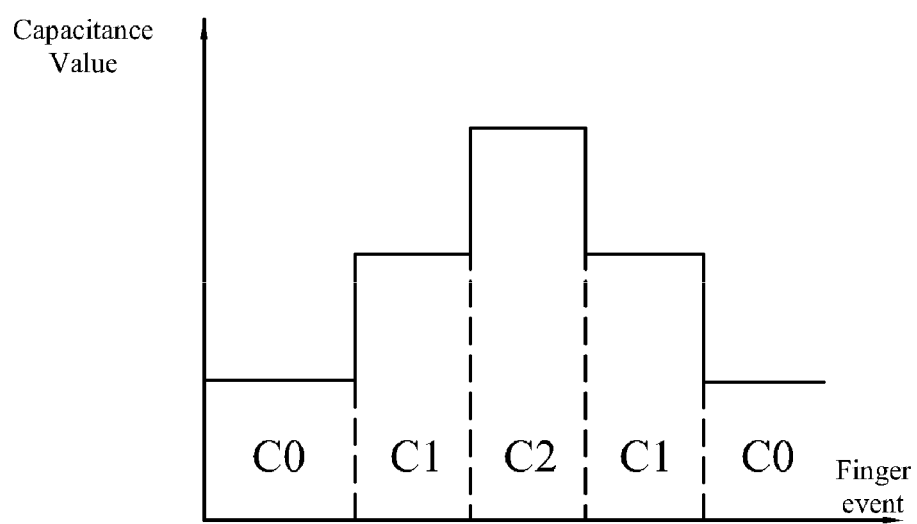
FIG. 11 is a graphic chart of capacitance result for various finger events with respect to the keyboard.

FIG. 11 shows capacitance variation in response to various finger event on the keyboard key. For example, when the finger is far away from the keyboard, the capacitance probed in the circuit is C0, when the finger gently touches the key area (stays on it without exerting a depressing force) or remains on the key area just after releasing the depressing, the capacitance probed in the circuit is C1, and when the finger exerts a force to depress the keyboard key, the capacitance probed in the circuit is C2. The capacitances above have a relation as follows: C2>C1>C0. Given the above, the openings allow the keyboard of the present invention not only to perform its intended input function as ordinary one, but to add a gesture operation function.

Figure 12:
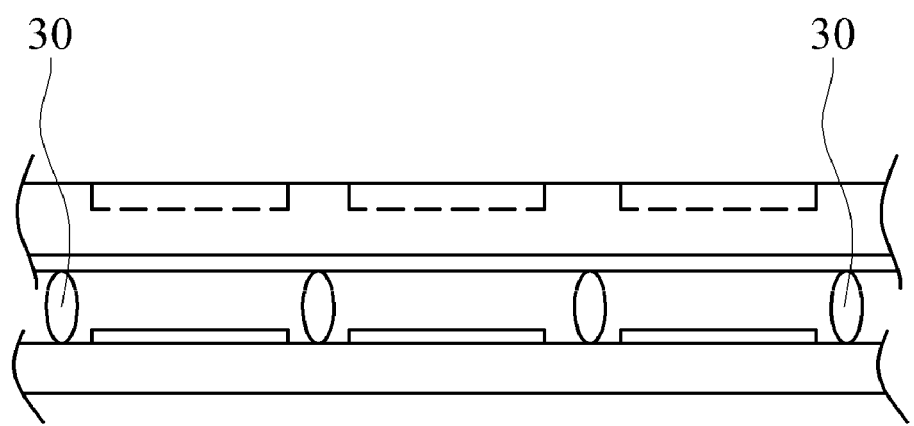
FIG. 12 is a capacitive touch keyboard according to a third embodiment of the present invention.

Referring to FIG. 12, a third embodiment of the present invention; the example is similar to the first one except for that the OCR or OCA plate serving as an intermediate layer is replaced with plural spacers 30. This kind of configuration provides a capacitor structure as well.

Figure 13:
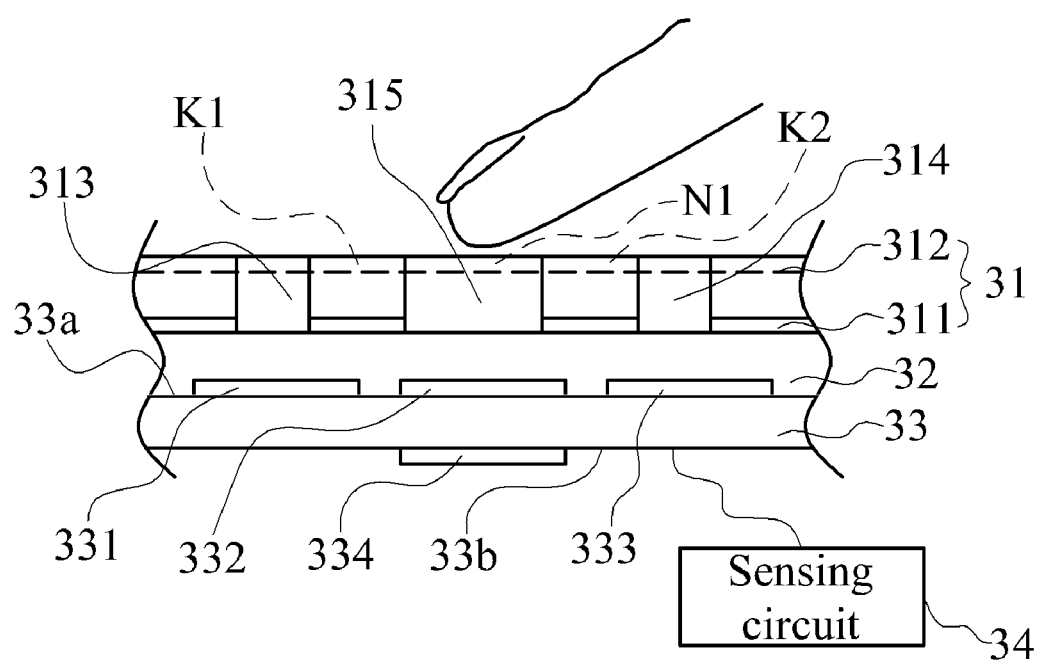
FIG. 13 is a capacitive touch keyboard according to a fourth embodiment of the present invention.

Referring to FIG. 13, a fourth embodiment of the present invention; in practical, to increase the signal stability, a ground plane is preferred disposed at the back side of a PCB, which will be illustrated in this example. A capacitive touch keyboard comprises a soft shielding layer 31 comprising a first ground plane 311 and a dielectric material 312 covering on the first ground plane 311, a one dimensional sensor layer 33, and a soft intermediate layer 32 between the former two. The soft shielding layer 31 also includes plural key areas such as K1 and K2 at the outer surface, and openings 313 and 314 corresponding to the key areas K1 and K2. Between the key areas K1 and K2 there exists a non-key area N1, and it is implemented by a between-keys space 315 (as an opening) provided in the soft shielding layer 31.

The one dimensional sensor layer 33 includes plural sensing cells 331 to 333 where the first sensing cells 331 and 333 correspond to the key areas K1 and K2 while the second sensing cell 332 to the non-key area N1. Respective cells are electrically connected to a capacitance sensing circuit 34. Operation for the key areas K1 and K2 is the same as that in the second embodiment and thus omitted here. When a finger approaches the area N1, a finger capacitance is produced, based on the same principle as for the openings 313 and 314. By offering plural between-keys spaces, a user is allowed to perform a gesture operation and therefore a touch keyboard has an added value. In this case, in order to give the same feeling of key operating as conventional keyboard, it is better to mount a key cap in each key area while adjacent key caps are separated by a clearance.

For improved signal stability, the non-key area N1, a two-layered PCB (serving as the one dimensional sensor layer 33) has a second ground plane 334 on a back side 33b opposite to a front side 33a which the cells 331 to 333 are disposed on, and in the example the second ground plane 334 corresponds to the cell 332 only. In addition, by providing a stimulus voltage to first or second ground plane 334 (for example, from the sensing circuit 34) and the first or second ground plane 334 further emitting the stimulus out for coupling with any approaching object such as a finger, thereby an extremely sensitive proximate sensing can be achieved. It is noted that in this embodiment, plural non-key areas (and also between-keys spaces) and second ground planes are involved though only one for each is shown in the figure (some are overlapping).

The foregoing description, for purposes of explanation, was set forth in specific details of the preferred embodiments to provide a thorough understanding of the invention. However, it will be apparent to one skilled in the art that specific details are not required in order to practice the invention. Therefore, the foregoing descriptions of specific embodiments of the invention are presented for purposes of illustration and description only and should not be construed in any way to limit the scope of the invention. They are not intended to be exhaustive or to limit the invention to the precise forms disclosed; obviously, many modifications and variations are possible in view of the above teachings. The embodiments were chosen and described in order to best explain the principles of the invention and its practical applications, thereby enabling others skilled in the art to best utilize the invention and various embodiments with various modifications as are suited to the particular use contemplated. It is intended that the following Claims and their equivalents define the scope of the invention.

What is claimed is:

1. A capacitive touch keyboard, comprising:
a soft shielding layer comprising a first ground plane and a dielectric material covering on the first ground plane, wherein the soft shielding layer also comprises plural key areas at an outer surface;
a one dimensional sensor layer comprising plural first sensing cells corresponding to the plural key areas;
a soft intermediate layer interposed between the first ground plane of the soft shielding layer and the one dimensional sensor layer so as to form a capacitor structure; and
a capacitance sensing circuit electrically connected to the plural first sensing cells to probe a capacitance change.

2. The capacitive touch keyboard of claim 1, wherein the dielectric material is referred to PMMA, PET film, or rubber.

3. The capacitive touch keyboard of claim 1, wherein the dielectric material is provided with plural imprinted externally visible key labels corresponding to the key areas.

4. The capacitive touch keyboard of claim 1, wherein the soft intermediate layer is made of plural spacers.

5. The capacitive touch keyboard of claim 1, wherein the soft shielding layer is provided with plural openings corresponding to the key areas with each opening exposing the soft intermediate layer.

6. The capacitive touch keyboard of claim 1, wherein each of the plural first sensing cells is surrounded by six other cells so as to form a honeycomb pattern altogether.

7. The capacitive touch keyboard of claim 1, wherein the first ground plane of the shielding layer is made of copper, silver paste, indium tin oxide, ATO, IZO, ZnO or the combination thereof.

8. The capacitive touch keyboard of claim 1, wherein the one dimensional sensor layer is connected to the capacitance sensing circuit through an FPC.

9. The capacitive touch keyboard of claim 1, wherein the soft shielding layer further comprises a non-key area formed as a between-keys space between the adjacent key areas, and the one dimensional sensor layer further comprises a second sensing cell corresponding to the non-key area.

10. The capacitive touch keyboard of claim 9, wherein the one dimensional sensor layer further comprises a second ground plane disposed at a side opposite to all sensing cells and corresponding to the between-keys space.

11. The capacitive touch keyboard of claim 10, wherein the capacitance sensing circuit provides a stimulus voltage to the second ground plane.

12. A capacitive touch keyboard, comprising:
a soft shielding layer comprising a ground plane and a dielectric material covering on the ground plane, wherein the soft shielding layer also comprises plural key areas at an outer surface;
a one dimensional sensor layer comprising plural sensing cells corresponding to the plural key areas, wherein each of the plural sensing cells is shaped as a hexagon so as to form a honeycomb pattern altogether, wherein a unit of the honeycomb pattern includes a center hexagon surrounded by six adjacent hexagons;
a soft intermediate layer interposed between the ground plane of the soft shielding layer and the one dimensional sensor layer so as to form a capacitor structure; and
a capacitance sensing circuit electrically connected to the plural sensing cells to probe a capacitance change.

13. The capacitive touch keyboard of claim 12, wherein the dielectric material is provided with plural imprinted externally visible key labels corresponding to the key areas.

14. The capacitive touch keyboard of claim 12, wherein the soft intermediate layer is made of plural spacers.

15. The capacitive touch keyboard of claim 12, wherein the soft shielding layer is provided with plural openings corresponding to the key areas with each opening exposing the soft intermediate layer.

16. The capacitive touch keyboard of claim 12, wherein the ground plane of soft shielding layer is made of copper, silver paste, indium tin oxide, ATO, IZO, ZnO or the combination thereof.

17. A capacitive touch keyboard, comprising:
a soft shielding layer comprising a ground plane and a dielectric material covering on the ground plane, wherein the soft shielding layer also comprises plural key areas at an outer surface;
a one dimensional sensor layer comprising plural sensing cells corresponding to the plural key areas, wherein each of the plural sensing cells is shaped as hexagon so as to form a honeycomb pattern altogether, wherein a unit of the honeycomb pattern includes a center hexagon surrounded by six adjacent hexagons;

a soft intermediate layer interposed between the ground plane of the soft shielding layer and the one dimensional sensor layer so as to form a capacitor structure; and a capacitance sensing circuit electrically connected to the plural sensing cells to probe a capacitance change;

wherein the soft shielding layer is provided with plural openings corresponding to the key areas with each opening exposing the soft intermediate layer.

18. The capacitive touch keyboard of claim 17, wherein the soft intermediate layer is made of plural spacers.

19. The capacitive touch keyboard of claim 17, wherein the ground plane of soft shielding layer is made of copper, silver paste, indium tin oxide, ATO, IZO, ZnO or the combination thereof.

20. The capacitive touch keyboard of claim 17, wherein the dielectric material is provided with plural imprinted externally visible key labels corresponding to the key areas.

* * * * *